US 6,424,687 B1

(12) United States Patent
Tian et al.

(10) Patent No.: US 6,424,687 B1
(45) Date of Patent: Jul. 23, 2002

(54) METHOD AND DEVICE FOR ALIGNMENT OF AUDIO DATA FRAMES USING INTERPOLATION AND DECIMATION

(75) Inventors: Wenshun Tian; Kah Yong, both of Singapore (SG)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 09/268,539

(22) Filed: Mar. 15, 1999

(51) Int. Cl.$^7$ .............................. H04L 7/00; H03L 7/00
(52) U.S. Cl. ........................ 375/354; 327/151; 327/160
(58) Field of Search ................................ 375/354, 355; 341/61; 327/141, 160, 144, 145, 151; 713/400, 500, 502, 503

(56) References Cited

U.S. PATENT DOCUMENTS

| 4,855,683 A | | 8/1989 | Troudet et al. ............. 328/155 |
|---|---|---|---|
| 5,528,183 A | * | 6/1996 | Maturi et al. ............... 327/151 |
| 5,577,080 A | | 11/1996 | Sakaue et al. .............. 375/376 |
| 5,652,532 A | | 7/1997 | Yamaguchi ................... 327/39 |
| 5,696,462 A | * | 12/1997 | Maturi et al. ............... 327/151 |
| 5,790,615 A | | 8/1998 | Beale et al. ................. 375/376 |
| 5,982,305 A | * | 11/1999 | Taylor ........................... 341/61 |
| 6,137,349 A | * | 10/2000 | Menkhoff et al. .......... 327/552 |

* cited by examiner

Primary Examiner—Betsy L. Deppe
(74) Attorney, Agent, or Firm—George O. Saile & Assoc.; Steven Lin, Esq.

(57) ABSTRACT

A method and device to synchronize sampled digital data transferred from an input section to an output section prevents data overrun or underrun due to timing differences of timing signals of the input and output section. The timing synchronization device has an input sampled data counter to determine a number of samples in a frame time of the input sampled data. The timing synchronization device further has an interpolator to estimate data sample values for each sample of the input sampled data to coincide with each sample of the output sampled data if the number of samples in said input sampled data is less than an expected number of samples in said output sampled data. If the number of samples in said input sampled data is greater than the expected number of samples in the output sampled data, the timing synchronization device has a decimator to remove any excess samples of the input sampled data and to extrapolate each data sample of the input sampled data to coincide with each sample of the output sampled data. The timing synchronization device has a low pass filter connected to the interpolator and the decimator to prevent any aliasing of the output sampled data and a calculate and control means connected to the input sampled data counter, the interpolator, the decimator, and the low pass filter to control the operation.

17 Claims, 7 Drawing Sheets

METHOD AND DEVICE FOR ALIGNMENT OF AUDIO DATA FRAMES USING INTERPOLATION AND DECIMATION

BACKGROUND OF THE INVENTION

1. Field of the Invention

This invention is related to synchronization of digital data formed by sampling analog signals and transmitted on a digital interface from the sampling device to a receiving and converting device. More particularly this invention relates to methods and devices that eliminate data "overrun" or "underrun" due to differences in the sampling times of the sampling device and receiving and converting device.

2. Description of the Related Art

Figure 1:
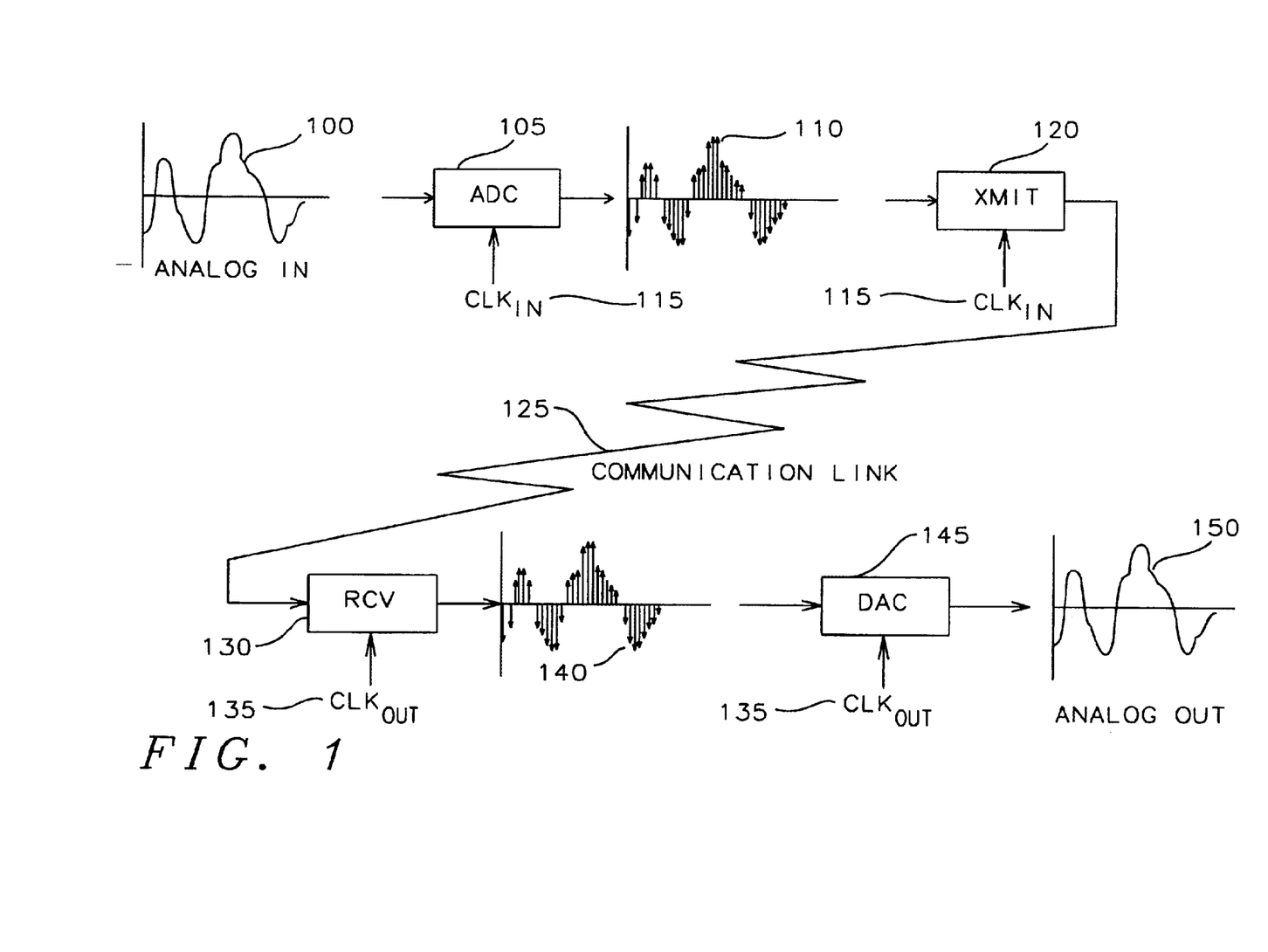
FIG. 1 is a block diagram of a communication system employing sampled digital data.

To understand the problem solved by this invention, refer now to FIG. 1. An analog electrical signal 100 is created by a transducer such as a microphone in response to a physical phenomenon. The analog electrical signal is the input to an analog-to-digital converter (ADC) circuit 105. At periodic conversion times established by the timing signal $CLK_{IN}$ 115, the ADC circuit 105 have an output digital signal 110 indicating the magnitude of the analog electrical signal at each of the periodic conversion times. The output digital signal 110 is then transferred to a transmitter 120 for transmission on a communication link 125. The communication link may be a telephone connection or any other known digital communication protocol.

Figure 2A:
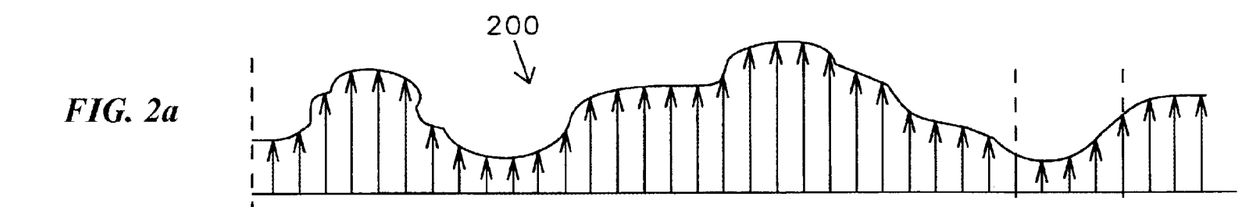
FIGS. 2a–2d are timing diagrams illustrating differences in timings of an input timing signal and an output timing signal that causes sampled digital data overrun and underrun.
Figure 2B:
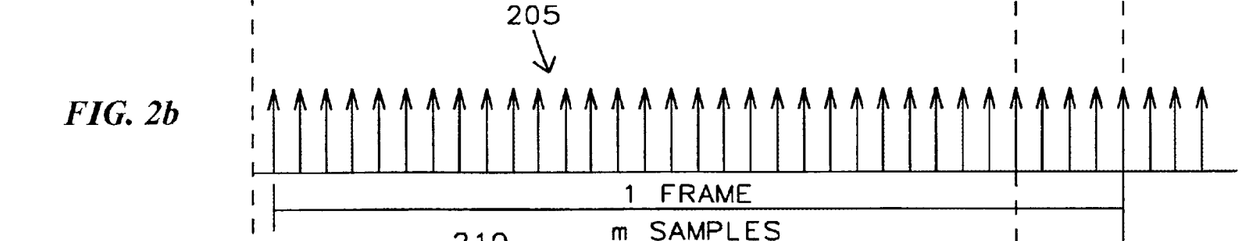

Often digital communication protocols divide the output digital signal 110 into frames or blocks for transmission on the communication link 125. Plots 200 and 205 respectively of FIGS. 2a and 2b show a single frame of data consisting in this instance of 32 digitized samples of the analog signal. Depending on the digital communication protocol each frame of the digitized samples has a header and trailer (not shown) appended respectively to the frame of the digitized samples. The header and trailer contain information such as timing, error detection cods, source and destination codes, and beginning and ending of transmission codes.

The header and trailer information is appended in the transmitter 120 and removed in the receiver circuit 130 after receiving the frame of the digitized samples.

The received digitized samples 140 are then transferred to a digital-to-analog converter (DAC) circuit 145. The DAC circuit converts the received digitized samples 140 to an analog output signal 150. The analog output signal 150 is used to drive an output transducer such as a speaker to convert the analog output signal 150 to a physical phenomenon.

The receiver circuit 130 and DAC circuit 145 are each synchronized by the timing signal $CLK_{OUT}$ 135. For a communication network as shown in FIG. 1 to operate error free, the timing signals $CLK_{IN}$ 115 and $CLK_{OUT}$ 135 should have equal frequencies or periods. In practice, this is not feasible. FIGS. 2b and 2d show two timing signals that have slightly different frequencies. The timing signal 205 has a lower frequency or a longer period than the timing signal 215. This forces the frame length of plot 205 of FIG. 2b to be longer than that of plot 215 of FIG. 2d. Further, values of the magnitudes of the digitized samples will be in error as shown in plots 200 and 205 respectively of FIGS. 2a and 2b.

Figure 3A:
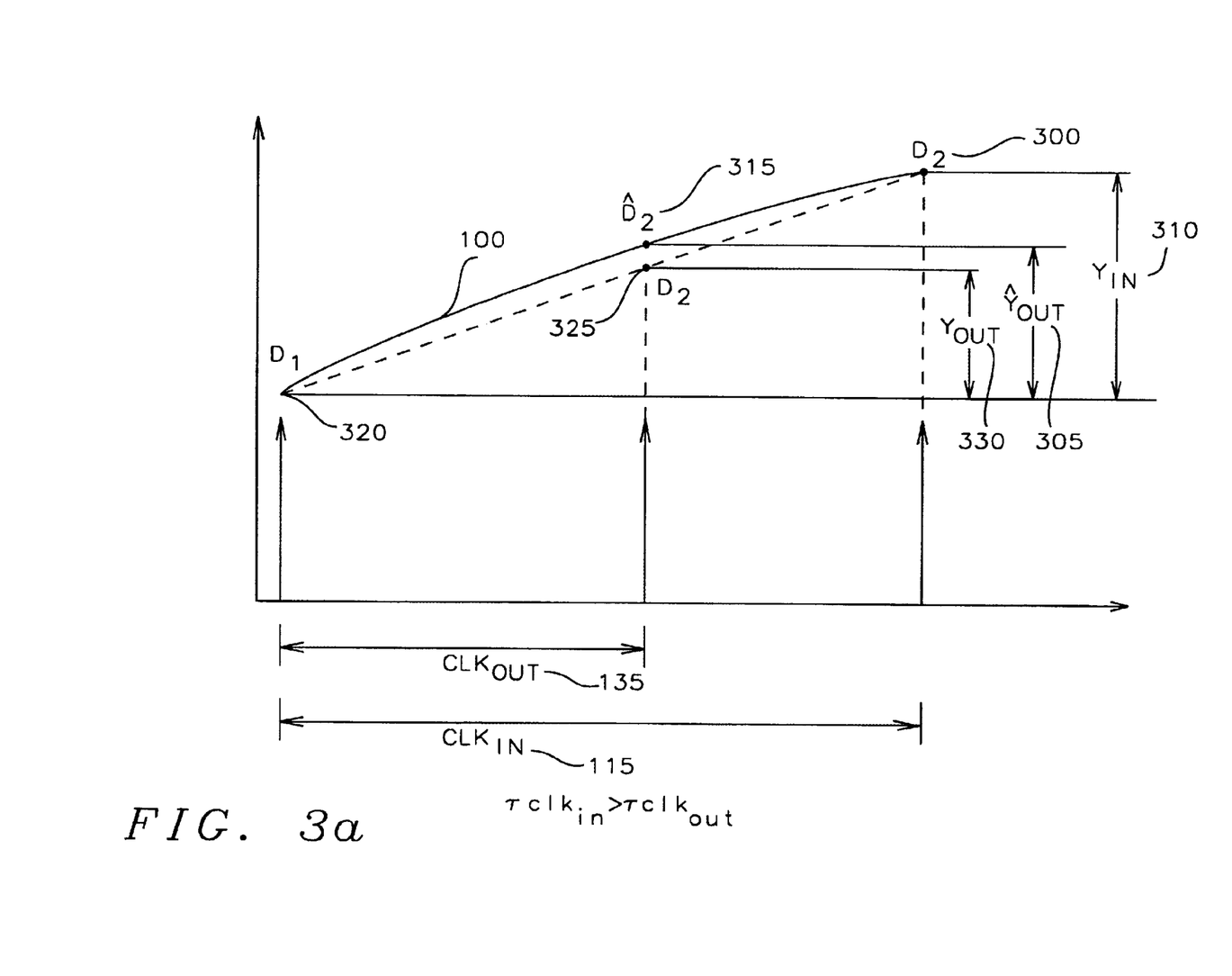
FIGS. 3a and 3b are timing diagrams showing the results on the sampled digital data of difference in timing of the input timing signals and output timing signals.

FIG. 3a illustrates the instance where timing signal of the $CLK_{IN}$ 115 has a longer period or lower frequency than that of the timing signal $CLK_{OUT}$ 135. The amplitude $Y_{IN}$ 310 is the value of the input sample $D_2$ 300. If the frequency of the input timing signal $CLK_{IN}$ 115 were the same as the output timing signal $CLK_{OUT}$ 135, the amplitude $Y_{OUT}$ 305 is the value that the sample $D_2$ 315 should have to produce the analog output signal 150 of FIG. 1.

Figure 3B:
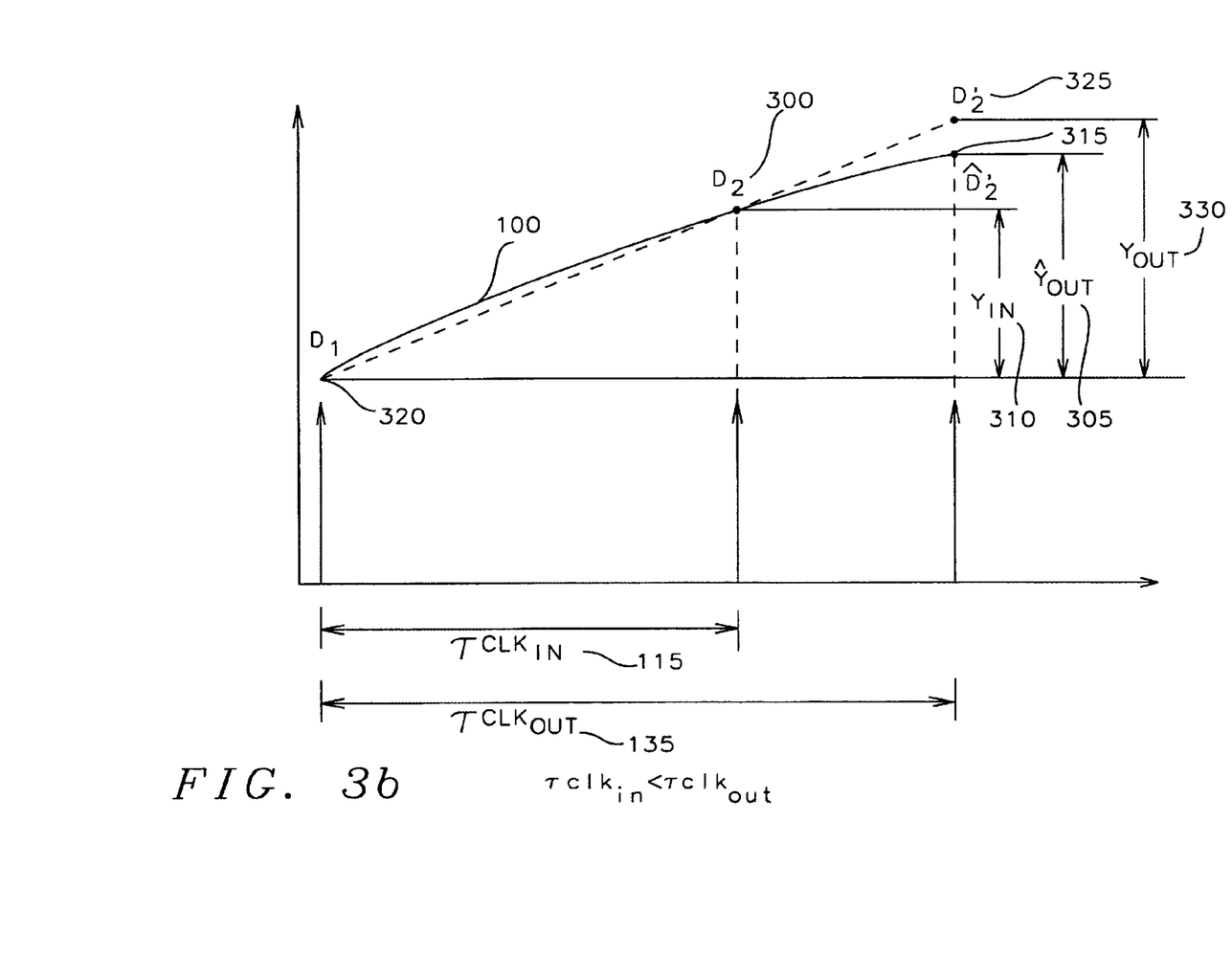

Alternatively, FIG. 3b illustrates the instance where input timing signal of the $CLK_{IN}$ 115 has a shorter period or higher frequency than the output timing signal $CLK_{OUT}$ 135. As in the case of FIG. 3a, the amplitude $Y_{IN}$ 310 is the value of the input sample $D_2$ 300. As described in FIG. 3a, if the frequency of the output timing signal $CLK_{IN}$ 115 were the same as the output timing signal $CLK_{OUT}$ 135, the amplitude $Y_{OUT}$ 305 is the value that the sample $D_2$ 315 should have to reproduce the analog signal 150 of FIG. 1.

Referring back to FIGS. 2a to 2d, if the input timing signal $CLK_{IN}$ 115 of FIG. 1 has a lower frequency as shown in plot 205 of FIG. 2b than the output timing signal $CLK_{OUT}$ 135 of FIG. 1 as shown in plot 215 of FIG. 2d, the receiver 130 will sample the output digital data that is shown in plot 200 of FIG. 2a. Since there are fewer samples of the output digital data 130 than expected during the period of one frame of the output timing signal 215, there will be an overrun of the digital data. The output timing signal 215 will receive multiple copies of samples for the output digital data 140 causing extreme distortion in the analog output signal 150.

Figure 2C:
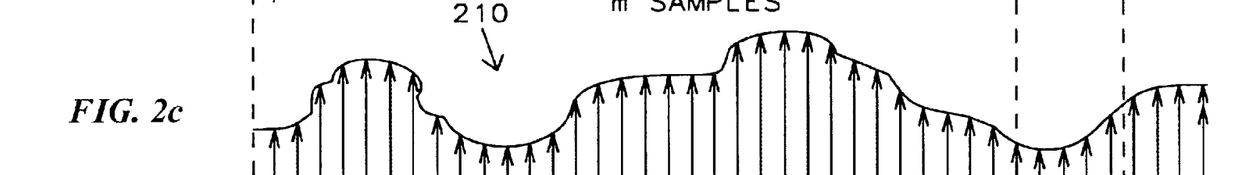
Figure 2D:
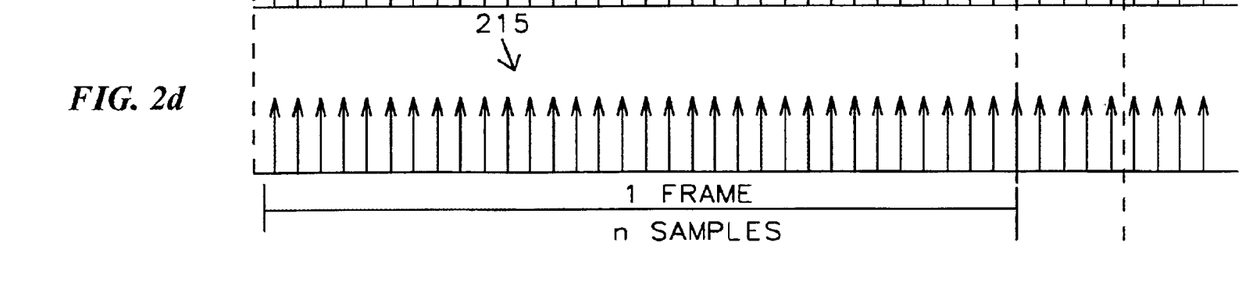

Conversely, if the input timing signal $CLK_{IN}$ 115 has a higher frequency as shown in plot 215 of FIG. 2d than the output timing signal $CLK_{OUT}$ 135 as shown in plot 205 of FIG. 2b, the receiver 130 will sample the output digital data that is shown in plot 210 of FIG. 2c. Since there are now more samples of the output digital data 130 than expected during the period of one frame of the output timing signal 205, there will be an underrun of the digital data. The output timing signal 205 will miss capturing some of the samples of the output digital data 140. This again caused extreme distortion in the analog output signal 150.

Typically, the output timing signal 135 is synchronized to the transitions of the output digital data 110 employing a phase locked oscillator similar to those described in U.S. Pat. No. 5,577,080 (Sakaue et al.), U.S. Pat. No. 5,790,615 (Beale et al.), U.S. Pat. No. 5,652,532 (Yamaguchi), and U.S. Pat. No. 4,855,683 (Troudet et al.).

Sakaue et al. describes a digital phase-locked loop (DPLL) circuit, which achieves a high-precise phase matching between input and output clocks at high speed, irrespective of phase difference between both. The DPLL has a phase comparator for sequentially comparing an input clock with an output clock in phase and outputting phase comparison result signals. The DPLL has a random walk filter for sequentially adding and accumulating the comparison result signals inputted by the phase comparator, discriminating a relative magnitude between the obtained addition data and threshold value information, and outputting a frequency change signal corresponding to the discriminated result and the phase shift amount information. The DPLL further has a variable frequency oscillator for generating the output clock according to the frequency change signal, and a filter coefficient generating circuit for changing and outputting at least one of the outputted threshold value information and the phase shift amount information according to the phase synchronous status supplied from an operation status detecting circuit.

Beale et al. teaches a digital phase-lock loop network that provides input and output clock signals to a to a data buffer contained in digital data receiving system. The digital phase-lock loop network provides bit clock synchronization using a fixed input clock and an output clock having a variable frequency that is adjusted to correspond to the average input rate of the data samples into the data buffer. The digital phase-lock loop network allows the data buffer to be operated as a temporary storage device maintaining a nominal number of data samples therein at all times by avoiding any overflow and underflow data handling conditions that may otherwise cause loss of data. The digital phase-lock loop network of Beale et al. is particularly suited for the Eureka-147 system, which has become a worldwide standard for digital audio broadcasting (DAB) technology.

Yamaguchi sets forth a frequency difference detection circuit capable of increasing the detection sensitivity for a frequency difference and shortening the frequency difference detection time. The frequency difference detection circuit comprises a first phase locked loop (PLL) for detecting a phase difference between an input clock and an output clock in response to the input clock and performing control to gradually suppress the detected phase difference to zero, a second PLL for detecting a phase difference between the input clock and an output clock in response to the input clock and performing control to suppress the detected phase difference to zero at a speed higher than that of the first PLL. The frequency difference detection circuit further has a first phase difference detection means for detecting a phase difference between the input clock and the output clock from the first PLL and a second phase difference detection means for detecting a phase difference between the input clock and the output clock from the second PLL. A phase difference processing means processes a detection of a difference between the phase difference detected by the first and second phase difference detection means. Finally, a frequency difference detection means detects a frequency difference between the input clock and a reference frequency from a detection output from the phase difference processing means.

Troudet et al. discloses a digital phase locked loop operable over a wide dynamic range has jitter performance that is exactly bounded within predetermined limits. The phase locked loop includes an accumulator-type digital voltage controlled oscillator which generates from a high speed system clock, an output clock signal at frequency equal to p times the frequency of an input clock signal, and which output frequency is controlled by the value k of a digital input to the VCO. A frequency window comparator compares the number of output clock pulses between input clock pulses to determine, based on the count, whether the frequency of the output is too high, too low or equal to the correct frequency. A phase window comparator simultaneously determines from the phase of the output clock signal whether the phase is leading, lagging or within a prescribed window of acceptability. In response to these determinations, the k-controller increases k to increase the frequency of the VCO when the frequency window comparator indicates the frequency is low or the phase window comparator indicates the phase is lagging; alternatively, k is decreased when the frequency is high or the phase is leading. Adjustment continues until the output clock is at the proper frequency and phase of the output falls within the window of acceptability.

SUMMARY OF THE INVENTION

An object of the present invention is to provide a method and device to synchronize a frame of sampled digital data transferred from an input section to an output section. The sampled digital data indicates the magnitude of an analog electrical signal.

Another object of this invention is to prevent data overrun or underrun due to timing differences of timing signals of the input and output section.

Further, another object of this invention is to eliminate accumulation of timing misalignment of an input sampled data and an output timing signal in a digital communications system transferring digital signals representing sampled analog signals.

To accomplish these and other objects a timing synchronization device has an input sampled data counter to determine a number of samples in a frame time of the input sampled data. The timing synchronization device further has an interpolator to estimate data sample values for each sample of the input sampled data to coincide with each sample of the output sampled data if the number of samples in the input sampled data is less than an expected number of samples in the output sampled data. If the number of samples in the input sampled data is greater than the expected number of samples in the output sampled data, the timing synchronization device has a decimator to remove any excess samples of the input sampled data and to extrapolate each data sample of the input sampled data to coincide with each sample of the output sampled data. The timing synchronization device has a low pass filter connected to the interpolator and the decimator to prevent any aliasing of the output sampled data.

A calculate and control means is connected to the input sampled data counter, the interpolator, the decimator, and the low pass filter. The calculate and control means receives the number of samples in the input sampled data and compares the number of samples in the input sampled data with an expected number of samples in the output sampled data. If the number of samples in the input sampled data is less than the expected number of samples in the output sampled data, the calculate and control means causes the interpolator to estimate the data sample values. However, if the number of samples in the input sampled data is greater than the expected data, the calculate and control means causes the decimator to remove the excess samples and extrapolate each data sample. The calculate and control means determines a cutoff frequency of the low pass filter to prevent the high frequency aliasing terms.

The interpolator estimates the data sample values for each sample of the input sampled data by solving the formula:

$$D'_2 = D_1 + (D_2 - D_1)\frac{CNT}{CNT_{expected}}$$

where:
- $D_2'$ is an estimated data sample,
- $D_1$ is a previous input data sample,
- $D_2$ is a present input data sample,
- CNT is the number of samples in the input sampled data, and
- $CNT_{expected}$ is the number of samples expected in the output sampled data.

The decimator estimates the data sample values for each sample of the input sampled data by solving the formula:

$$D'_2 = D_2 + (D_2 - D_1)\frac{CNT - CNT_{expected}}{CNT_{expected}}$$

where
- $D_2'$ is an estimated data sample,
- $D_1$ is a previous input data sample,
- $D_2$ is a present input data sample,
- CNT is the number of samples in the input sampled data, and
- $CNT_{expected}$ is the number of samples expected in the output sampled data.

The low pass filter convolves the input sampled data into a frequency spectrum of the input sampled data and the low pass filter performs a function of the form $$\frac{\sin x}{x}$$

of the frequency spectrum to provide the low pass filtering.

A second embodiment of the timing synchronization device is to synchronize a timing of an input sampled data to a first timing signal to prevent data overrun and data underrun of the input sampled data due to timing differences of a second timing signal to which the input sampled data is synchronized and the first timing signal. The timing synchronization device has an input sampled data counter to determine a number of samples in the input sampled data. A count comparator compares the number of samples in the current data frame of the input sampled data with an expected number of data samples of the current data frame of the input sampled data.

If the number of input sampled data is less than the number of expected sampled data, an interpolator creates a value that is one half a sum of a magnitude of a last data sample of the input sampled data of the current data frame and a magnitude of the a first input data sample of a next data frame. The interpolator then appends the interpolated value after the last data sample of the input sampled data of the current data frame to form a current data frame of the output sampled data. However, if the number of samples in the current data frame of the input sampled data is greater than the expected number of data samples of the current data frame of the input sampled data, a decimator determines an average value of the last data sample of the current data frame and a second to last data sample of the current data frame and then inserts the average value to the second to last data sample of the current data frame. The decimator then discards the last data sample to form a current data frame of the output sampled data. The timing synchronization device may optionally have a low pass filter to filter the current frame of the output sampled data to prevent any aliasing of the output sampled data.

The synchronization of the timing of the input sampled data to prevent data overrun and data underrun of the input sampled data due to timing differences of an input sampling clock and an output sampling clock is accomplished within a signal processing system by first counting the number of input sampled data within a data frame. The number of input sampled data is compared with an expected number of input sampled data.

If the number of input sampled data is less than the number of expected sampled data, each sample of the input sampled data is interpolated to coincide with each sample of the output sampled data. Any missing sample of the output sampled data not coinciding with the input sampled data are formed by inserting new estimated data samples to the output sampled data. If the number of input sampled data is greater than the number of expected sampled data, each sample of the input sampled data is extrapolated to coincide with each sample of the output sampled data. Excess data samples not coinciding with the output sampled data are discarded. The output sampled data are then, optionally, low pass filtered to prevent any aliasing of the output sampled data.

A second embodiment of the method to synchronize a timing of an input sampled data to an output timing signal describes a method to prevent data overrun and data underrun of the input sampled data due to timing differences of an input timing signal to which the input sampled data is synchronized and the output timing signal. The method begins by counting the number of input sampled data within a current data frame. The number of input sampled data is compared with an expected number of input sampled data within the current data frame. If the number of input sampled data is more than one less than the number of expected sampled data, a magnitude that is a last data sample of the input sampled data of the current data frame and a magnitude of a first data sample of the input sampled data of a next data frame are interpolated as the average of the two magnitudes of the last data sample and the first data sample of the next data frame. The new interpolated value is then appended to the input sampled data to form a current data frame of the output sampled data. However, if the number of input sampled data of the current data frame is more than one greater than the number of expected sampled data, an average value of the last data sample of the input sampled data and a second to last data sample of the current data frame is determined. The average value is then inserted to the second to last data sample and the last data sample is discarded or decimated to form the current data frame of the output sampled data. The output sampled date may optionally be low pass filtered to prevent any aliasing of the output sampled data.

DETAILED DESCRIPTION OF THE INVENTION

In the communication system of FIG. 1, the analog signal 100 is sampled periodically by the input timing signal 115 to produce the sampled digital data 110. The stream of sampled digital data 100 may be modified in particular fashions and still maintain the information inherent in the original analog signal.

In FIG. 3a, the samples $D_1$ 320 and $D_2$ 300 are the magnitudes of the analog signal as determined by the sampling of the input timing signal 115. The analog signal 100 can be approximated by a summation of a series of sinusoids. With appropriate calculation, any point between $D_1$ 320 and $D_2$ 300 can be determined. If the output timing signal 135 has a higher frequency or shorter period than the input timing signal 115, the expected magnitude for the sample $\hat{D}_2$ 315 can be approximated by the magnitude of the point $D_2'$ 325. The point $D_2'$ 325 is an interpolation of the straight line value between the data sample $D_1$ 320 and the data sample $D_2'$ 300. This is accomplished by solving the formula:

$$D_2' = D_1 + (D_2 - D_1)\frac{\tau CLK_{OUT}}{\tau CLK_{IN}} \qquad \text{Eq. 1}$$

where
- $D_2'$ is an estimated data sample,
- $D_1$ is a previous input data sample,
- $D_2$ is a present input data sample,
- $\tau CLK_{ou}$ is the number of samples in the input sampled data, and
- $\tau CLK_{IN}$ is the number of samples in the output sampled data.

Conversely, as shown in FIG. 3b, if the output timing signal 135 has a lower frequency or longer period than the input timing signal 115, the expected magnitude of the sample $\hat{D}_2$ 315 can be approximated by the magnitude of the point $D_2'$ 325. The magnitude of the point $D_2'$ 325 is an extrapolation of the straight line value between the data sample $D_1$ 320 and the data sample $D_2$ 300. This is accomplished by solving the formula:

$$D_2' = D_2 + (D_2 - D_1)\frac{\tau CLK_{OUT} - \tau CLK_{IN}}{\tau CLK_{IN}} \qquad \text{Eq. 2}$$

where
- $D_2'$ is an estimated data sample,
- $D_1$ is a previous input data sample,
- $D_2$ is a present input data sample,
- $\tau CLK_{ou}$ is the number of samples in the input sampled data, and
- $\tau CLK_{IN}$ is the number of samples in the output sampled data.

It can be seen in FIGS. 3a and 3b that the approximate value $D_2'$ 325 are more accurate than the original data sample $D_2$ 300 in the reproduction of the analog output signal if the input timing signal 115 is different from the output timing signal.

Figure 4:
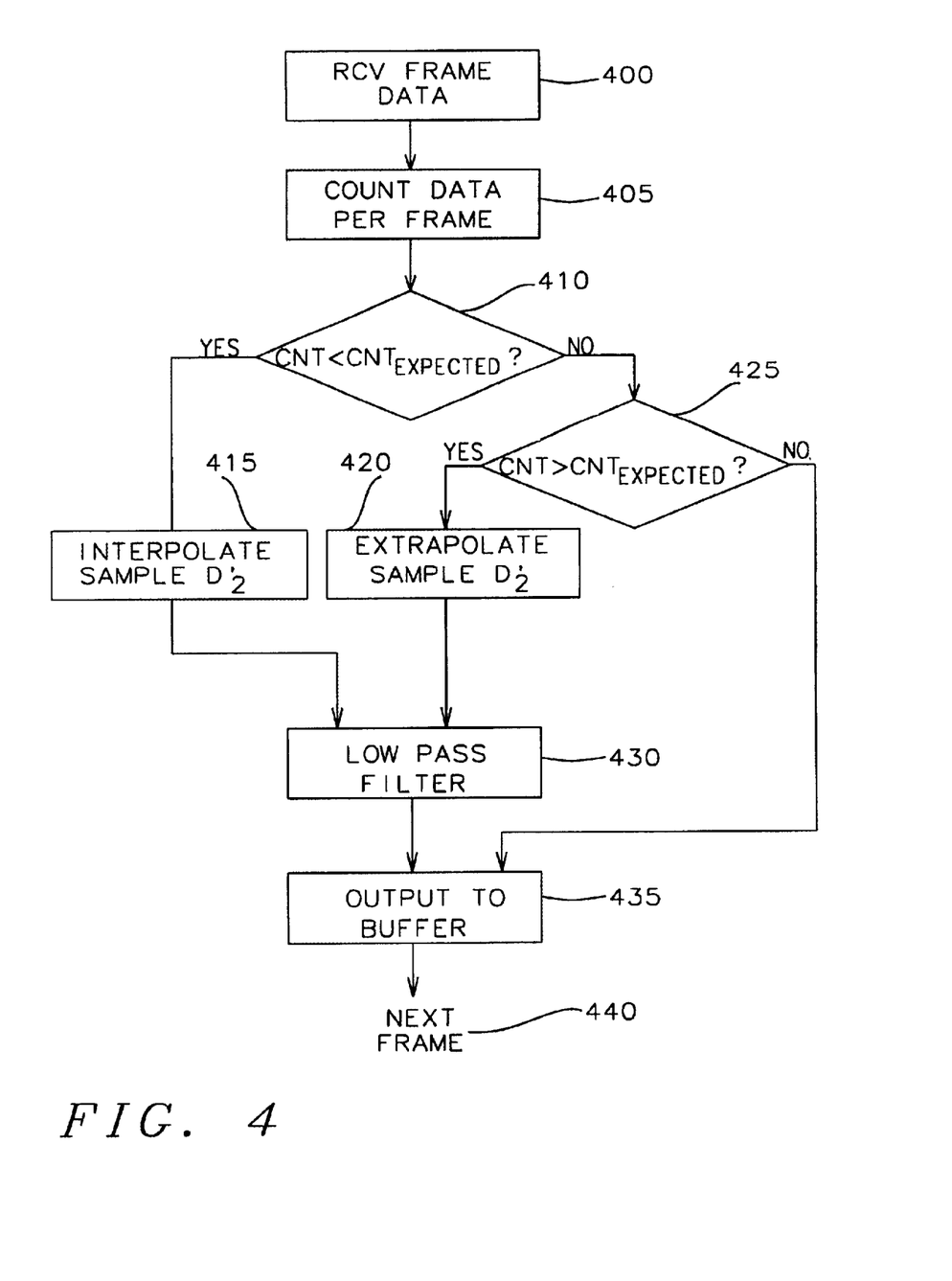
FIG. 4 is a flow chart of the method of this invention to synchronize sample digital data with an output timing signal.

Refer now to FIG. 4 for a discussion of the method to synchronize the sampled digital data to the output timing signal. A frame of the sampled digital data is received at block 400. The frame in this case is the time for the number of expected sampled digital data to be received. The number of received sampled digital data received in the frame is counted at block 405 and compared at decision block 410 to the expected count $CNT_{expected}$ of the sampled digital data.

If the count of the received sampled digital data is less than the expected count $CNT_{expected}$ of the sampled digital data at decision block 410, each data sample of the sampled digital data is interpolated at block 415 as shown in FIG. 3a and are found by the formula:

$$D_2' = D_1 + (D_2 - D_1)\frac{CNT}{CNT_{expected}} \qquad \text{Eq. 3}$$

where
- $D_2'$ is an estimated data sample,
- $D_1$ is a previous input data sample,
- $D_2$ is a present input data sample,
- CNT is the number of samples in the input sampled data, and
- $CNT_{expected}$ is the number of samples expected in the output sampled data.

If, on the other hand, the count of the received sampled digital data is greater than the expected count $CNT_{expected}$ at decision block 410, the count of the frame of the received sampled digital data is compared at decision block 425 to the expected count $CNT_{expected}$ of the sampled digital data. If the count of the received sampled digital data is greater than the expected count $CNT_{expected}$ at decision block 425, each data sample of the sampled digital data is extrapolated at block 420 as shown in FIG. 3b. The extrapolated data sample $D_2$ is found by solving the formula:

$$D_2' = D_2 + (D_2 - D_1)\frac{CNT - CNT_{expected}}{CNT_{expected}} \qquad \text{Eq. 4}$$

where
- $D_2'$ is an estimated data sample,
- $D_1$ is a previous input data sample,
- $D_2$ is a present input data sample,
- CNT is the number of samples in the input sampled data, and
- $CNT_{expected}$ is the number of samples expected in the output sampled data.

If the count of the received sampled digital data is not greater than the expected count $CNT_{expected}$ of the sampled digital data at decision block 425, it is equal to the expected count $CNT_{expected}$ and requires no processing. The method then proceeds from decision block 425 to block 435.

During the interpolation at block 415, data samples will be missing from the frame of the sampled digital data. The missing data samples are added during the interpolation process at block 415 so that each frame has the correct number of samples.

Conversely, during the extrapolation at block 420 there are extra data samples within the data frame. The extra data samples are discarded or decimated from the frame during the extrapolation process at block 420 so that each frame has the correct number of samples.

The frame of the interpolated sampled digital data and extrapolated sampled digital data is low pass filtered at block 430 to remove any aliasing from the addition and decimation of the data samples.

The low pass filtering is performed by convolving the sampled digital data to extract the representative frequencies within the frame of the sampled digital data. The low pass filtering of the form $$\frac{\sin x}{x}$$

or a sinc function is performed on the resulting frequencies. The sampled digital data is then reconstructed by convolving the representative frequencies according to the following function:

$$X_c(t) = \sum_{n=-\infty}^{+\infty} \left\{\frac{\text{Sin}[\pi^{(t-nT)/T}]}{[\pi^{(t-nT)/T}]}\right\} = \sum_{n=-\infty}^{+\infty} x(n)\,\text{Sinc}[\pi^{(t-nT)/T}] \qquad \text{Eq. 5}$$

where:
- $X_c(t)$ is the value of the sampled data at sample time t.
- T is the frame time.
- n is the sample counter
- x(n) is the value for the nth sampled data.

An example of the decimation of one sample from a frame of N samples is shown as:

$$t = n_k T + \frac{k}{N} T$$

$$X_c\left[\left(n_k + \frac{k}{N}\right)T\right] = \sum_{n=-\infty}^{+\infty} X(n) \, \text{Sinc}\left[\pi\left(\frac{k}{N} + (n_k - n)\right)\right]$$

$$= +\ldots$$

$$= X(n_k - 2)\text{Sinc}\left[\pi\left(\frac{k}{N} + 2\right)\right]$$

$$= X(n_k - 1)\text{Sinc}\left[\pi\left(\frac{k}{N} + 1\right)\right]$$

$$= X(n_k) \, \text{Sinc}\left[\pi\left(\frac{k}{N}\right)\right]$$

$$= X(n_k + 1) \, \text{Sinc}\left[\pi\left(\frac{k}{N} - 1\right)\right]$$

$$= X(n_k + 2) \, \text{Sinc}\left[\pi\left(\frac{k}{N} - 2\right)\right]$$

$$= +\ldots$$

The sampled digital data is transferred at block 435 to an output buffer and the next frame at block 440 is processed.

Figure 5:
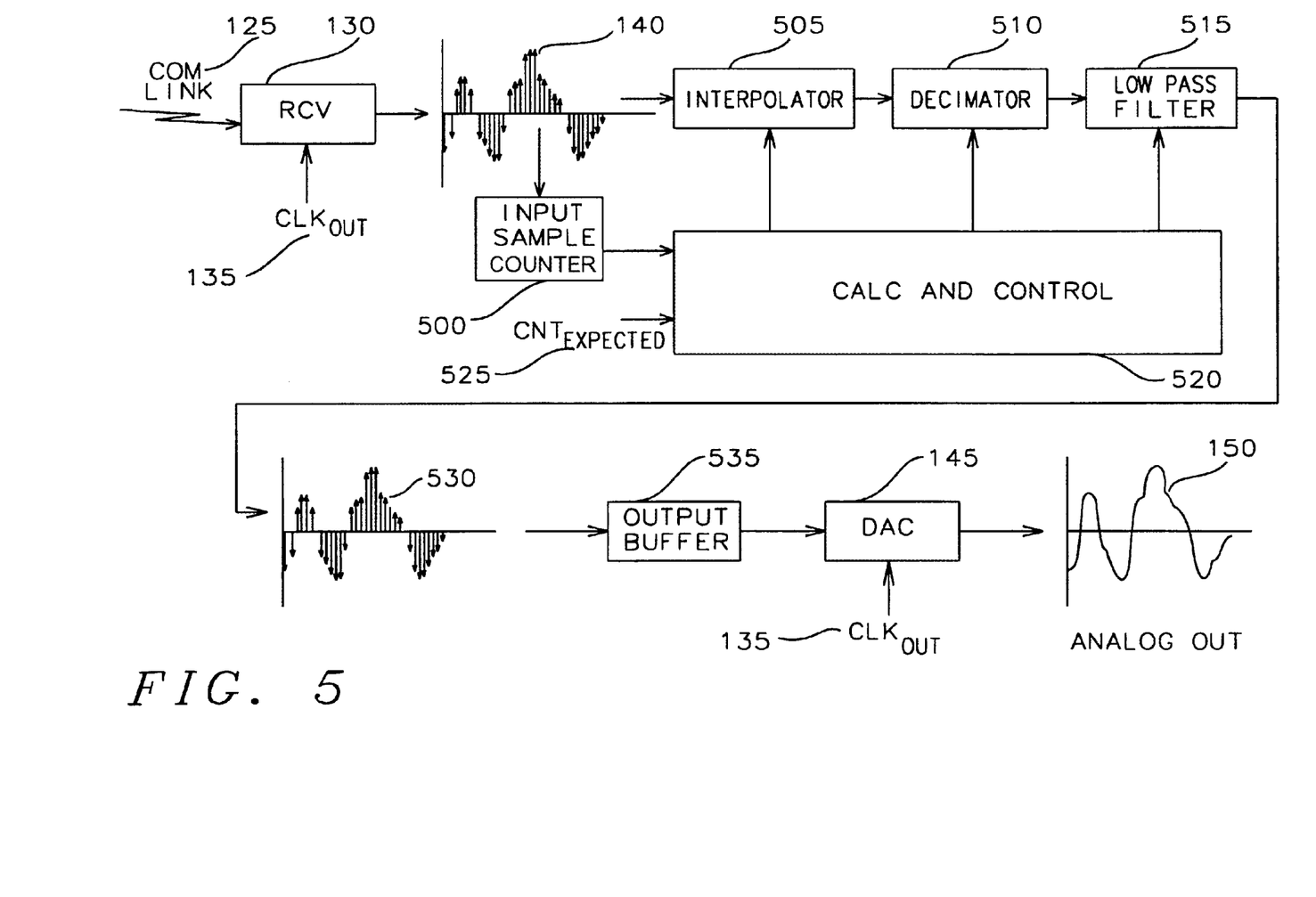
FIG. 5 is a block diagram of a communication system employing a timing synchronization device of this invention.

FIG. 5 illustrates a sample digital data communication system employing a device that will synchronize an input sampled digital data with an output timing signal. The communication link 125 transfers the output digital data to the receiver 130, as described in FIG. 1.

The received sampled digital data 140 is the input to the input sample counter 500. The input sample counter 500 determines the number of data samples within the period of one frame of the output timing signal $CLK_{OUT}$ 135. The count of the received sample digital data 140 is transferred to the calculation and control unit 520 and compared with the expected count $CNT_{expected}$ of the number of sampled data in the frame. The count of the received sample digital data 140 is transferred to the calculation and control unit 522 and compared with the expected count $CNT_{expected}$ of the number of sampled data in the frame.

If the count of the received sampled digital data 140 is less than the expected count $CNT_{expected}$ 525, the calculation and control unit 520 will activate the interpolator 505. The interpolator 505 receives a frame of the sampled digital data 140. Each sample is interpolated as shown in FIG. 3a and FIG. 4. The interpolator will calculate the interpolated sample $D_2'$ according to Eq. 3. Since there are fewer samples in the frame of the sampled digital data 140 than the expected count $CNT_{expected}$ 525, additional data samples must be appended to the frame of the received sampled digital data 140. These additional data samples are interpolated from the data samples of the received sampled digital data 140.

If the count of the received sampled digital data 140 is greater than the expected count $CNT_{expected}$ 525, the interpolator 505 is deactivated and the decimator 510 is activated. The decimator 510 receives a frame of the sampled digital data 140. Each sample is extrapolated as shown in FIG. 3b and FIG. 4. The decimator will calculate the extrapolated sample $D_2'$ according to Eq. 4. In this instance, there are excess data samples in the frame of the sampled digital data 140 than the expected count $CNT_{expected}$ 525. The excess samples must be discarded or decimated from the frame of the sampled digital data 140.

The decimated frame of the sampled digital data is transferred to the low pass filter 515. The calculation and control will set the filter parameter of the low pass filter 515 to eliminate any high frequency aliasing terms from the decimated frame of the sampled digital data.

The method to interpolate or decimate the sample is performed by the low pass filtering 515. The low pass filtering 515 is performed by is convolving the frame of sampled digital data to extract the magnitude of the representative frequencies within the frame of the sampled digital data. The low pass filter then performs a function of the form $$\frac{\sin x}{x}$$

or SINC function on the resulting frequencies. The sampled digital data is then reconstructed by convolving the representative frequencies as described in Eq 5.

The synchronized sampled digital data 530 is transferred to an output buffer 535. From the output buffer 535 the sampled digital data is transferred to the DAC 145. The DAC then creates the analog output signal 150.

Figure 6:
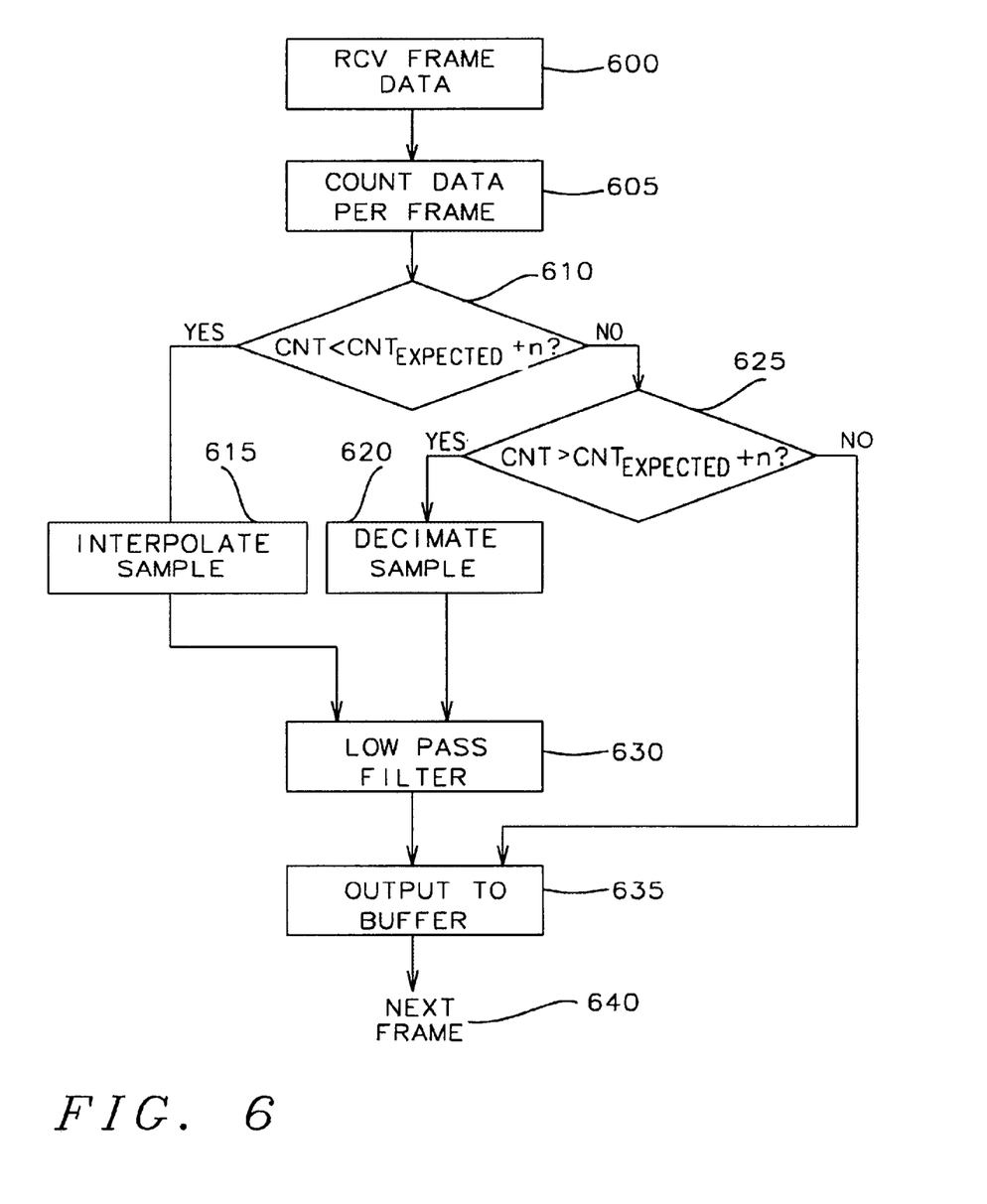
FIG. 6 is a flow chart of a second embodiment of the method of this invention to synchronize sampled digital data with the output timing signal.

Generally, the difference between the period of the input timing signal $CLK_{IN}$ 115 and the output timing signal $CLK_{OUT}$ 135 are such that the count of the received sampled digital data 140 is one or two samples more or less than the expected count $CNT_{expected}$ 525. If the count of the received sampled digital data 140 is one more or less than the expected count $CNT_{expected}$ 525, the differences in the analog output signal will be imperceptible and no modification of the received sampled digital data 140 is necessary. However, if the count of the received sampled digital data is two (or greater) more or less than the expected count $CNT_{expected}$ 525, a simplified embodiment method as shown in FIG. 6 can be employed to synchronize the sampled digital data to the output timing signal $CLK_{OUT}$.

The simplified embodiment to synchronize the sampled digital data with the output timing signal begins with receiving at block 600 a frame of sampled digital data. The number of data samples within a frame is counted at block 605. The count CNT of the sampled digital data is compared with an expected count $CNT_{expected}$ plus a factor n. The factor n is generally 1, but is sufficiently small to prevent distortion of the analog output signal.

If the count CNT is less than expected count $CNT_{expected}$ plus the factor n at decision block 610, the last sample of the present frame of sampled digital data is interpolated at block 615 with the first sample of the next frame of sampled digital data to form an intermediate data sample. The interpolation is performed by summing the last sample of the present frame with the first sample of the next frame and dividing the resulting sum by two. The intermediate data sample is then appended to the present frame of the sampled digital data to form an interpolated frame of the sampled digital data.

If the count CNT of the frame of the sampled digital data is not less than the expected count plus the factor n at decision block 610, the count of the frame of the sampled digital data is compared at decision block 625, again, to the expected count plus the factor n. If the count is not greater than the expected count $CNT_{expected}$ plus the factor n at decision block 625, then the frame of sampled digital data is synchronized to output timing signal $CLK_{OUT}$ and is transferred at block 635 to the output buffer for conversion to the analog output signal.

If the count CNT of the frame of the sampled digital data is greater than the expected count $CNT_{expected}$ plus the factor n at decision block 625, the frame of the sampled digital data is decimated at block 620. The decimation process is the summing of the last data sample and the second to last data sample of the frame of sampled digital data and dividing the resulting sum by two. This intermediate result is then replaced in the second to last sample and the last sample is discarded or decimated.

The decimated frame of the sampled digital data may be low pass filtered at block 630 as described above to eliminate any high frequency aliasing terms.

The synchronized sampled digital data is then transferred at block 635 to an output buffer for conversion to the analog output signal. The next frame at block 640 is then ready for processing by the method as above described.

It will be apparent to those skilled in the art, that the interpolation or extrapolation may be accomplished by low pass filtering using other functions such as polyphase filtering and still be in keeping with the intent of this invention.

While this invention has been particularly shown and described with reference to the preferred embodiments thereof, it will be understood by those skilled in the art that various changes in form and details may be made without departing from the spirit and scope of the invention.

The invention claimed is:

1. A timing synchronization device to eliminate timing misalignment of an input sampled data and an output sampled data comprising:
   an input sampled data counter to determine a number of samples in said input sampled data;
   an interpolator to estimate data sample values for each sample of the input sampled data to coincide with each sample of the output sampled data if the number of samples in said input sampled data is less than an expected number of samples in said output sampled data;
   a decimator to remove any excess samples of the input sampled data and to extrapolate each data sample of the input sampled data to coincide with each sample of the output sampled data, if the number of samples in said input sampled data is greater than the expected number of samples in the output sampled data; and
   a calculate and control means connected to the input sampled data counter, the interpolator, the decimator, and a low pass filter, whereby said calculate and control means receives the number of samples in the input sampled data and compares said number of samples in the input sampled data with the expected number of samples in the output sampled data, if the number of samples in the input sampled data is less than the expected number of samples in the output sampled data, the calculate and control means causes said interpolator to estimate the data sample values, if the number of samples in the input sampled data is greater than the expected data, the calculate and control means causes said decimator to remove the excess samples and extrapolate each data sample, and determines a cutoff frequency of said low pass filter.

2. The timing synchronization device of claim 1 wherein said sample data counter counts the number of data samples of the input sampled data with a frame time of the output sampled data.

3. The timing synchronization device of claim 1 wherein the interpolator estimates the data sample values for each sample of the input sampled data by solving the formula:

$$D'_2 = D_1 + (D_2 - D_1)\frac{CNT}{CNT_{expected}}$$

where
   $D_2'$ is an estimated data sample,
   $D_1$ is a previous input data sample,
   $D_2$ is a present input data sample,
   CNT is the number of samples in the input sampled data, and
   $CNT_{expected}$ is the number of samples expected in the output sampled data.

4. The timing synchronization device of claim 1 wherein the decimator estimates the data sample values for each sample of the input sampled data by solving the formula:

$$D'_2 = D_2 + (D_2 - D_1)\frac{CNT - CNT_{expected}}{CNT_{expected}}$$

where
   $D_2'$ is an estimated data sample,
   $D_1$ is a previous input data sample,
   $D_2$ is a present input data sample,
   CNT is the number of samples in the input sampled data, and
   $CNT_{expected}$ is the number of samples expected in the output sampled data.

5. The timing synchronization device of claim 1 wherein the low pass filter is coupled to the interpolator and the decimator to prevent any aliasing of the output sampled data.

6. The timing synchronization device of claim 5 wherein the low pass filter convolves said output sampled data into a frequency spectrum of said output sampled data and said low pass filter performs function of a form $$\frac{\sin x}{x}$$

of said frequency spectrum to provide the low pass filtering.

7. A method to synchronize a timing of an input sampled data to prevent data overrun and data underrun of said input sampled data due to timing differences of an input sampling clock and an output sampling clock, comprising the steps of:
   counting the number of input sampled data within a data frame;
   comparing said number of input sampled data with an expected number of output sampled data;
   if the number of input sampled data is less than the expected number of output sampled data, interpolating each sample of the input sampled data to coincide with each sample of an output sampled data and inserting new estimated data samples for any samples of the output sampled data not coinciding with the input sampled data; and
   if the number of input sampled data is greater than the expected number of output sampled data, extrapolating each sample of the input sampled data to coincide with each sample of the output sampled data and discarding excess data samples not coinciding with the output sampled data.

8. The method of claim 7 wherein interpolating estimates the data sample values for each sample of the input sampled data by solving the formula:

$$D'_2 = D_1 + (D_2 - D_1)\frac{CNT}{CNT_{expected}}$$

where
   $D_2'$ is an estimated data sample,
   $D_1$ is a previous input data sample, D$_2$ is a present input data sample, CNT is the number of samples in the input sampled data, and CNT$_{expected}$ is the number of samples expected in the output sampled data.

9. The method of claim 7 wherein extrapolating estimates the data sample values for each sample of the input sampled data by solving the formula:

$$D_2' = D_2 + (D_2 - D_1)\frac{CNT - CNT_{expected}}{CNT_{expected}}$$

where

D$_2$' is an estimated data sample,

D$_1$ is a previous input data sample,

D$_2$ is a present input data sample,

CNT is the number of samples in the input sampled data, and

CNT$_{expected}$ is the number of samples expected in the output sampled data.

10. The method of claim 7 further comprising the step of low pass filtering the output sampled data to prevent any aliasing of the output sampled data.

11. The method of claim 10 wherein the low pass filtering convolves said output sampled data into a frequency spectrum of said output sampled data and said low pass filter performs function of a form $$\frac{\sin x}{x}$$

of said frequency spectrum to provide the low pass filtering.

12. A method to synchronize a timing of an input sampled data to a first timing signal to prevent data overrun and data underrun of said input sampled data due to timing differences between a second timing signal to which the input sampled data is synchronized and the first timing signal, comprising the steps of:

counting a number of input sampled data within a current data frame;

comparing said number of input sampled data with an expected number of input sampled data within the current data frame;

if the number of input sampled data is less than one less than the number of expected sampled data, interpolating a value using a last data sample of the input sampled data of the current data frame and a magnitude of a first data sample of the input sampled data of a next data frame, and appending said value to the input sampled data to form a current data frame of output sampled data; and if the number of input sampled data of the current data frame is more than one greater than the number of expected sampled data, determining an average value of the last data sample of the input sampled data and a second to last data sample of the current data frame, inserting said average value to said second to last data sample, and discarding said last data sample to form the current data frame of the output sampled data.

13. The method of claim 12 further comprising the step of:

low pass filtering the current frame of the output sampled data to prevent any aliasing of said output sampled data.

14. The method of claim 13 wherein the low pass filtering performs a convolving of said output sampled data and said low pass filter performs function of a form $$\frac{\sin x}{x}$$

of a frequency spectrum to provide the low pass filtering.

15. A timing synchronization device to synchronize a timing of an input sampled data to a first timing signal to prevent data overrun and data underrun of said input sampled data due to timing differences of a second timing signal to which the input sampled data is synchronized and the first timing signal, comprising:

an input sampled data counter to determine a number of samples in a current frame of the input sampled data;

a count comparator to compare the number of samples in said current data frame of the input sampled data with an expected number of data samples of the current data frame of the input sampled data;

an interpolator to interpolate a value that is one half a sum of a magnitude of a last data sample of the input sampled data of the current data frame and a magnitude of the a first input data sample of a next data frame and to append said interpolated value after the last data sample of the input sampled data of the current data frame to form a current data frame of output sampled data, if the number of samples in said current data frame of the input sampled data is less than the expected number of data samples of the current data frame of the input sampled data; and a decimator to determine an average value of the last data sample of the current data frame and a second to last data sample of said current data frame, to insert said average value to said second to last data sample of the current data frame, and to discard said last data sample to form a the current data frame of the output sampled data.

16. A timing synchronization device of claim 15 further comprising a low pass filter to filter the current frame of the output sampled data to prevent any aliasing of said output sampled data.

17. The timing synchronization device of claim 16 wherein said low pass filter performs a convolving of said output sampled data into a frequency spectrum of said output sampled data and said low pass filter performs function of a form $$\frac{\sin x}{x}$$

of said frequency spectrum to provide the low pass filtering.

* * * * *